United States Patent
Kastenmeier et al.

(10) Patent No.: US 7,256,148 B2
(45) Date of Patent: Aug. 14, 2007

(54) METHOD FOR TREATING A WAFER EDGE

(75) Inventors: Bernd E. Kastenmeier, Austin, TX (US); Andreas Knorr, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 10/908,441

(22) Filed: May 12, 2005

(65) Prior Publication Data
US 2006/0258177 A1    Nov. 16, 2006

(51) Int. Cl.
    *H01L 21/26* (2006.01)
(52) U.S. Cl. ............... 438/798; 438/710; 257/E21.214
(58) Field of Classification Search ............... 438/457, 438/475, 477, 513
    See application file for complete search history.

(56) References Cited

U.S. PATENT DOCUMENTS 5,270,267 A      12/1993  Ouellet
5,425,846 A      6/1995   Koze et al.
6,020,639 A *    2/2000   Ulrich et al. ............... 257/750
6,642,128 B1     11/2003  Lu et al.
6,837,967 B1 *   1/2005   Berman et al. ........... 156/345.3
2003/0203650 A1* 10/2003  Robbins ..................... 438/782

OTHER PUBLICATIONS

IBM Technical Disclosure Bulletin, "Interface Toughening by Ion Implantation for Enhancement of Thin Film Adhesion," https://www.delphion.com/tdbs/tdb?order=90A+61781 , Jun. 1990, pp. 69-71.

* cited by examiner

*Primary Examiner*—Michael Lebentritt
*Assistant Examiner*—Cheung Lee
(74) *Attorney, Agent, or Firm*—William D. Sabo; Hoffman, Warnick & D'Alessandro LLC

(57) ABSTRACT

A method for treating an edge portion of a wafer with a plasma or select chemical formulation in order to enhance adhesion characteristics and inhibit delamination of a layer of material from the wafer surface only on the edge portion that is being treated. Alternatively, the method may be utilized to effectuate a cleaning of an edge portion of a wafer.

13 Claims, 6 Drawing Sheets

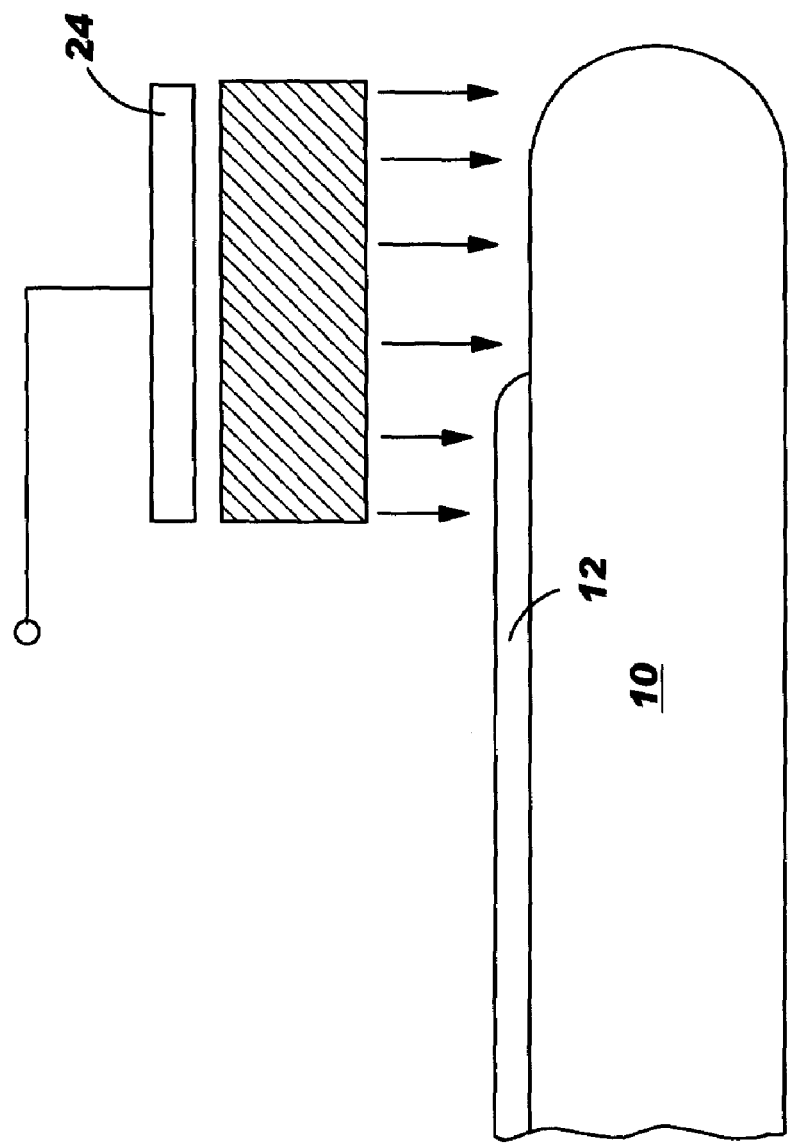

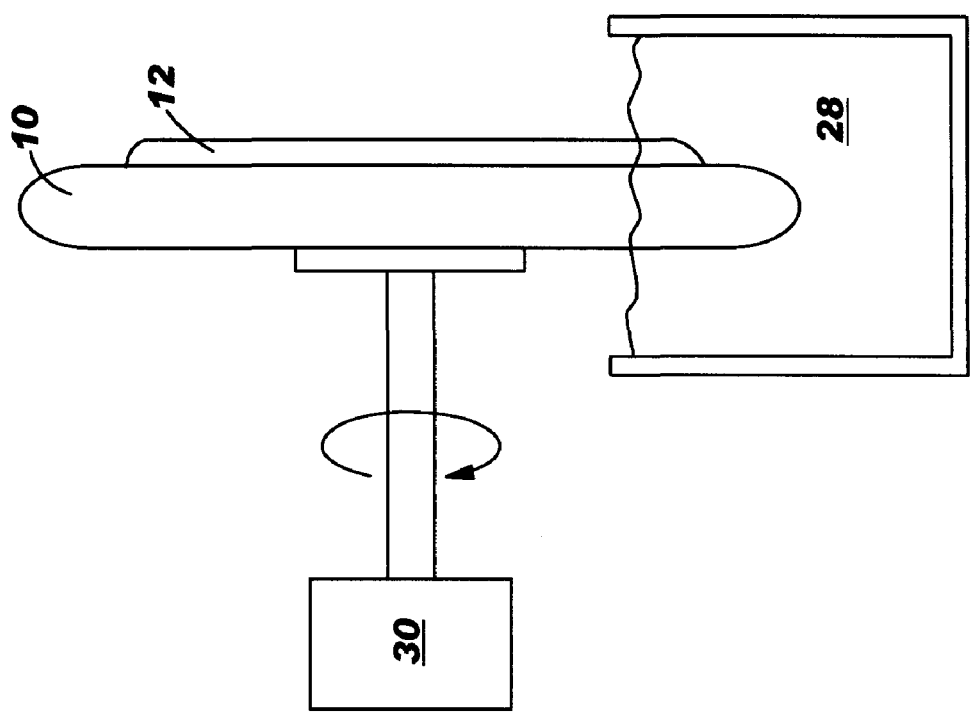

METHOD FOR TREATING A WAFER EDGE

BACKGROUND OF THE INVENTION

1. Technical Field

The present invention relates generally to processing wafers, and more particularly relates to a method for treating an edge portion of a wafer with a plasma or select chemical formulation in order to enhance adhesion characteristics and inhibit delamination of a layer of material from the wafer surface or to clean the wafer surface only on the edge portion that is being treated.

2. Related Art

Delamination is a major problem for the integration of interconnect structures for integrated circuits. Delamination occurs during chemical-mechanical polishing (CMP) of layered stacks of films, and is due to the inherently poor mechanical qualities of the materials used. The problem is especially prevalent in the edge region of the wafer since the induced stress during CMP is highest in regions of great surface topology.

Prior art treatments to prevent delamination treat the entire wafer area. These treatments cause the surface of the treated material to densify, thus hardening the surface, and are accompanied by compositional changes of material. While addressing the issue of delamination, these whole-wafer treatments cause unacceptable new problems, including: uncontrolled change in the composition chemistry of the treated material, moisture uptake after the treatment, increases in the relative permeability of the dielectric materials, and the introduction of a new interface inside the treated material between the densified surface and the untreated bulk.

U.S. Pat. No. 6,642,128, "Method for High Temperature Oxidations to Prevent Oxide Edge Peeling," issued to Lu et al. on Nov. 4, 2003, which is hereby incorporated by reference, teaches a method for preventing oxide peeling by applying a silicon nitride layer to a backside of a wafer prior to carrying out high temperature annealing. Unfortunately, the teachings are limited to, inter alia, batch processing, require the presence of a silicon nitride film, and the processing according to the teaching impacts the entire wafer surface.

Accordingly, a need exists for an improved method for preventing delamination that occurs during CMP.

SUMMARY OF THE INVENTION

The present invention addresses the above-mentioned problems, as well as others, by providing a method for treating an edge portion of a wafer with a plasma or select chemical formulation in order to enhance adhesion characteristics and inhibit delamination of a stack of material from the wafer surface only on the edge portion that is being treated, or to clean a wafer surface on the edge portion only.

In a first aspect, the invention provides a method for treating an outside edge region of a wafer comprising: applying a protective film over a central region of the wafer such that only an outer edge region of both the wafer and stack of material on the wafer surface are exposed; and applying a plasma treatment to the wafer, wherein the protective film protects a central portion of the stack of material and limits treatment to the outer edge region of both the wafer and stack of material on the wafer surface.

In a second aspect, the invention provides a method for treating an outside edge region of a wafer comprising: providing a plasma delivery system that limits a plasma exposure to an outer edge region of both the wafer and stack of material; and applying a plasma treatment to the outer edge region of both the wafer and stack of material, wherein a central portion of the stack of material situated on the wafer is not exposed to the plasma treatment.

In a third aspect, the invention provides a method for treating an outside edge region of a wafer, comprising: dispensing a wet chemical solution by means of, e.g., a nozzle, a chemical bath or a brush, only to an outer edge region of both the wafer and stack of material situated on a wafer surface; and rotating the wafer so that the wet chemical solution treats an entire outer perimeter of the wafer and stack of material situated on a wafer surface, wherein a central portion of the wafer and stack of material situated on the wafer is not exposed to the wet chemical solution.

BRIEF DESCRIPTION OF THE DRAWINGS

The embodiments of this invention will be described in detail, with reference to the following figures, wherein like designations denote like elements, and wherein:

FIG. 3 depicts a partial side view of a wafer receiving a localized plasma treatment in accordance with an embodiment of the present invention.

FIG. 6 depicts a side view of a wafer receiving a localized bath in accordance with an embodiment of the present invention.

Figure 1A:
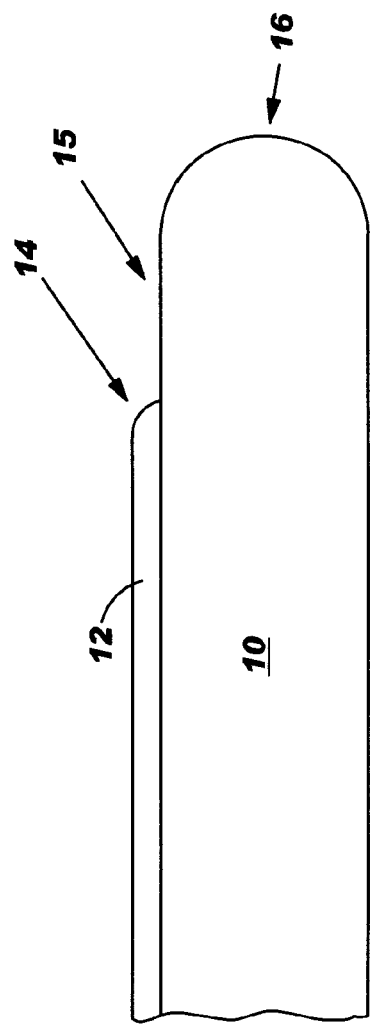
FIG. 1A depicts a partial side view of a wafer in which a portion of the stack has been removed.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

Figure 1B:
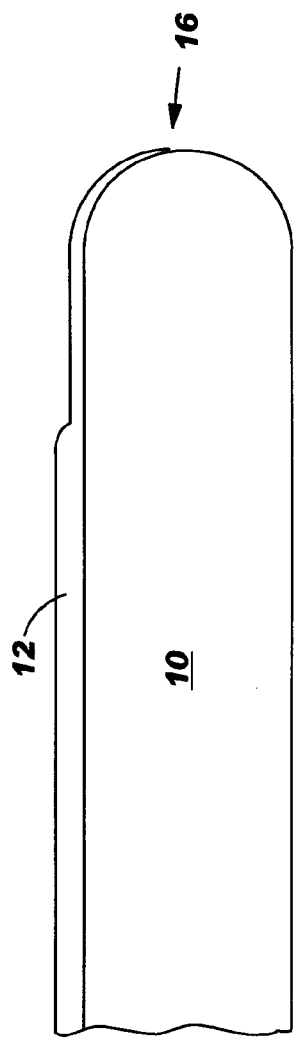
FIG. 1B depicts a partial side view of a wafer in which the stack extends to the beveled edge portion of the wafer.

Referring now to the Figures, FIGS. 1A and 1B depict side views of a substrate 10 having a thin film or thin film stack (hereinafter "stack" or "stack of material") 12 on a surface of the substrate 10. In FIG. 1A, a portion of the stack 12 on the outer edge 15 of the wafer has been removed, e.g., with edge bead removal (EBR), as is typical for films applied from wet solution by spinning. In FIG. 1B, stack 12 extends to the beveled edge region 16 of the substrate, as is typical for chemical-vapor-deposited (CVD) films. Stack 12 may comprise, e.g., silicon dioxide, silicon nitride, silicon carbide, organo-silicate glasses (OSG), organic polymer-based materials, methyl-silsesquioxane (MSQ) based materials, all of which can be dense or porous, or metallic films.

Moreover, stack 12 may include any number of layers/films (i.e., one or more), comprising one or more materials. Substrate 10 may comprise, e.g., a silicon wafer, a stack of thin films, etc. As noted above, during CMP, significant stress occurs at edge bead 14 of the stack 12 (FIG. 1A), as well as at a beveled edge region 16 (FIG. 1B). In either case, this causes the stack 12 to delaminate. Furthermore, certain processing steps, especially dry etching, tend to leave residue at the edge region of the substrate 10.

The present invention addresses these problems by restricting a treatment to only an outer edge area of the substrate 10. In particular, the treatment may result in a modification, e.g., densification, of only the stack 12 around the outer edge region. Thus, any detrimental effects of the treatment are limited to an extreme edge area of the wafer, thereby not impacting the performance of the final fabricated chip devices on a central portion of the substrate 10. Described below are several embodiments for implementing the invention. Note that while the embodiments discussed below are described for the case shown in FIG. 1A in which a portion of the stack 12 on the outer edge 15 of the wafer has been removed, the invention may be applied to, inter alia, the case described in FIG. 1B in which stack 12 extends to the beveled edge region 16.

Figure 2:
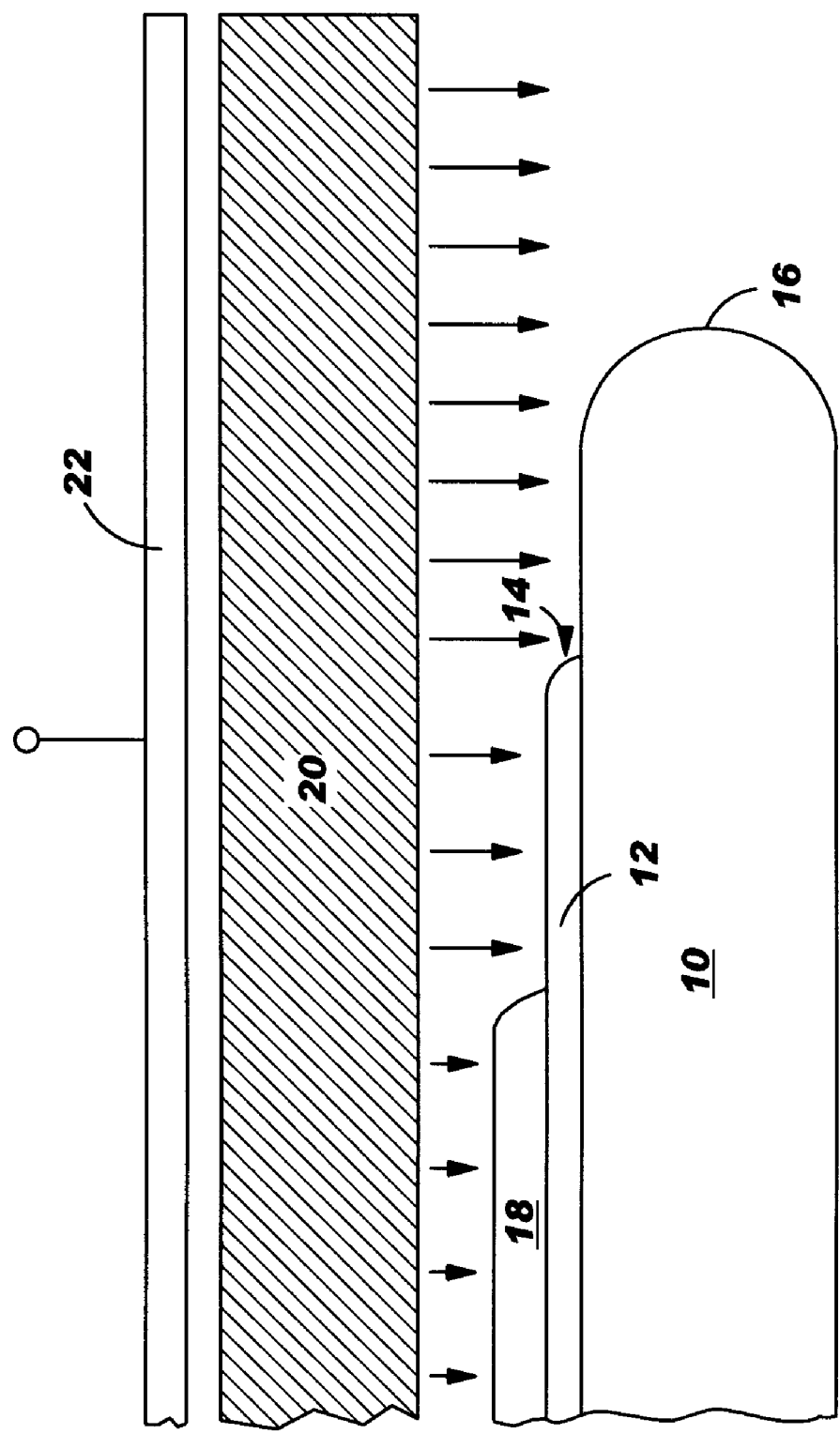
FIG. 2 depicts a partial side view of a wafer receiving a plasma treatment in accordance with an embodiment of the present invention.

FIG. 2 depicts a first embodiment for implementing the invention. Namely, as shown in FIG. 2, a protective film 18 is first placed onto the stack 12 in order to protect the central portion of the substrate 10 and stack 12, so that only the outer edge region of the substrate 10 and stack 12 are exposed. Protective film 18 may comprise, e.g., a photoresist layer such as those applied in commercial 356 nm (I-line) implant resist systems, or another protective layer. A portion of the protective film 18 is then removed, either by edge bead removal (EBR) or other techniques, such as conventional lithographic patterning. The removed portion of the protective film 18 is large enough to expose an outside edge region of the stack 12 and the substrate 10. For example, for a spin-on film with an EBR distance of 2 mm, the EBR distance for the protective layer 18 will be greater than 2 mm, e.g., 3 mm, exposing a 1 mm ring of film at the outer substrate edge. Next a plasma 20 (or effluent of the plasma) is delivered by a plasma device 22 onto the substrate 10 and stack 12 (shown by downward arrows). Protective film 18 restricts exposure of the plasma 20 to only the outer edge region of the substrate 10 and the outer edge of thin film 12. Thus, the central portion of both the substrate 10 and stack 12 are not treated. Subsequently, protective film 18 can be removed using any known methodology.

Note that the treatment of the outer edge region may simply comprise a cleaning operation. A cleaning of the substrate 10 can be effectuated using the techniques described herein, e.g., if the removed portion of the protective layer 18 is not large enough to expose the stack 12, thus allowing, e.g., cleaning of the substrate edge without impacting the stack 12.

Figure 5:
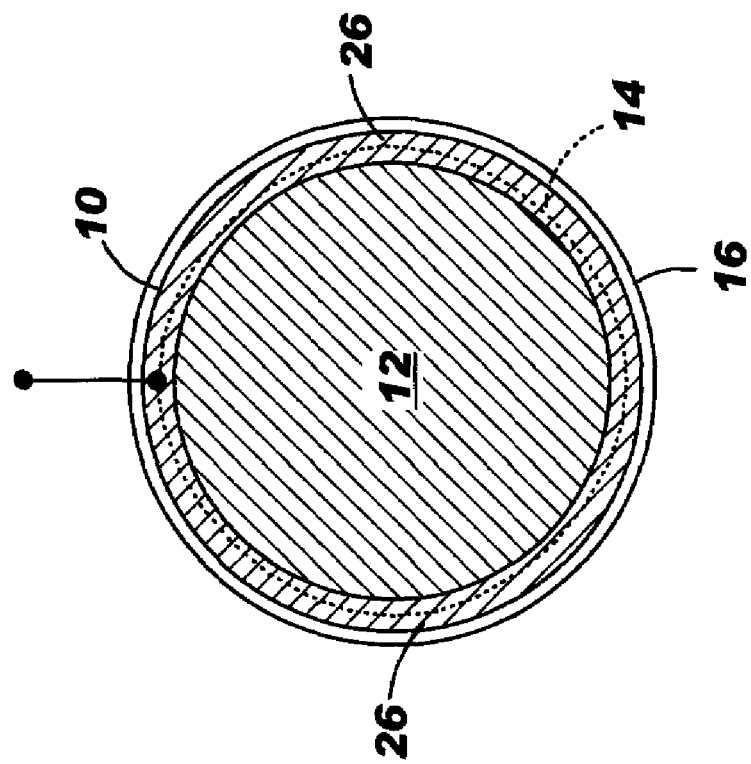
FIG. 5 depicts a top view of an alternative system for generating a localized plasma treatment in accordance with embodiment of FIG. 3.
Figure 4:
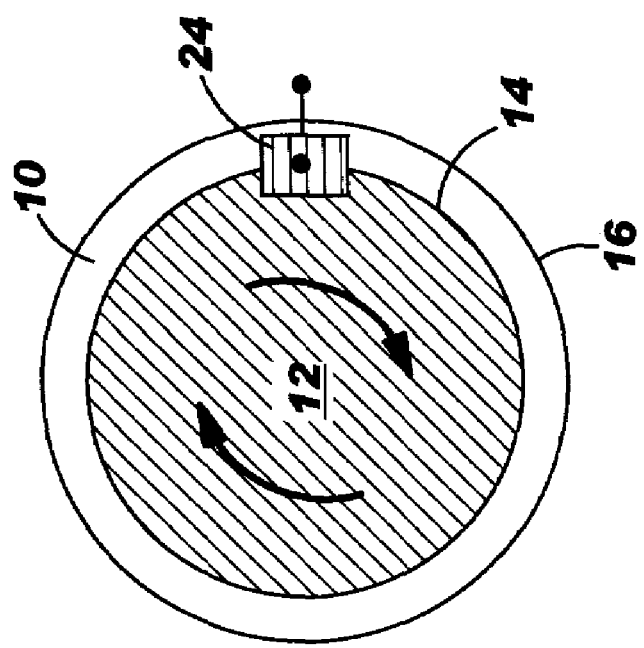
FIG. 4 depicts a top view of a system for generating a localized plasma treatment in accordance with embodiment of FIG. 3.

FIG. 3 depicts a second embodiment in which a small area plasma device 24 is provided for delivering plasma 26 to a localized area along an outer edge region (shown by downward arrows) of substrate 10 and stack 12. FIGS. 4 and 5 depict illustrative alternatives for implementing this embodiment, both being shown as top views. In FIG. 4, small area plasma device 24 sits above a portion of an outer edge region of substrate 10. When the substrate 10 is rotated, as shown by directional arrows, the entire outer circumferential region of both substrate 10 and stack 12 is treated. The central portion of both substrate 10 and stack 12 remain untreated. FIG. 5 depicts an alternative embodiment in which a plasma generating ring 26 is placed above the substrate 10 such that it covers the entire outer regions of both substrate 10 and stack 12. Again, the central portion of the substrate 10 remains untreated. Note that depending on the specific requirements, plasma device 24 or plasma ring 26 may extend over the beveled edge 16.

Any type of plasma and/or plasma device that will cause a reaction that leads to the desired surface modifications, such as densification and hardening of the treated surface, changes in the chemical composition of the surfaces, e.g., oxidation or nitridation, removal of some exposed material, or cleaning, may be utilized. For instance, an RF plasma may be generated with a metallic electrode, and gases typically used in the field, such as Argon, Oxygen or Nitrogen.

FIG. 6 depicts a further embodiment of a system for treating an outer edge region of both a substrate 10 and stack 12 using a wet chemistry solution. In this case, a chemical bath 28 is provided that receives an outside edge of both the wafer 10 and film 12. A rotating device 30 is then used to rotate wafer 10 such that the entire outer perimeter of wafer 10 and stack 12 pass through the bath 28. Alternatively, the chemical solution could be dispensed through a nozzle over the outer edge region of substrate 10 as the substrate 10 rotates. An additional protective layer (e.g., photoresist) may be utilized, such as that described above with respect to FIG. 2, to protect the central region of the substrate 10.

Figure 7:
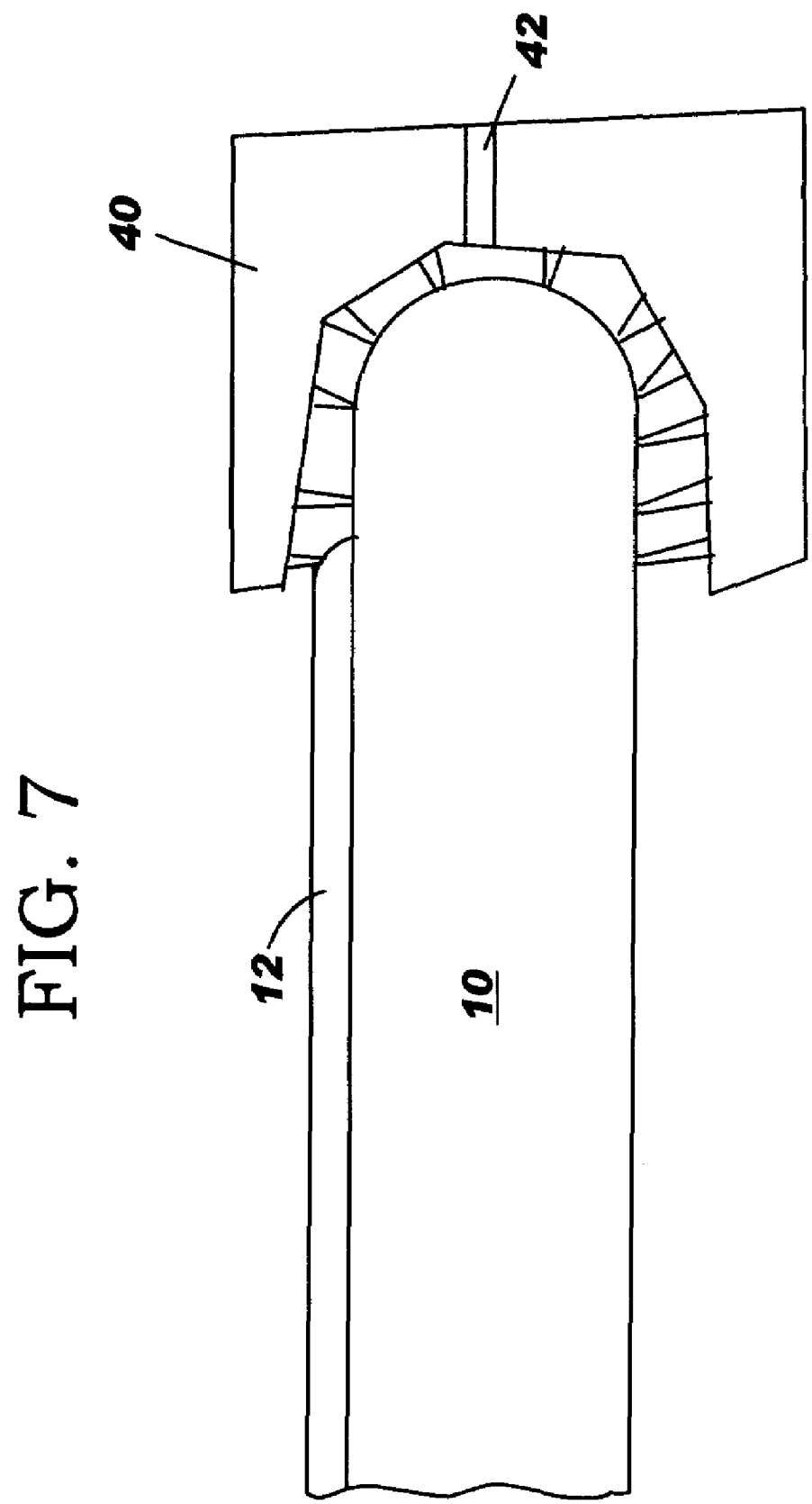
FIG. 7 depicts a side view of a wafer receiving a brush treatment in accordance with an embodiment of the present invention.

FIG. 7 depicts an alternative embodiment in which a brush 40 have a dispensing channel 42 is utilized to process, i.e., treat or clean, an edge portion of the wafer. In this embodiment, either the wafer or the brush 40 may be rotated to effectuate processing along the edge. As shown, the brush may extend around of the edge of the wafer to process the top, side and bottom. Alternatively, the brush may be configured to just process part (e.g., a top surface) of the edge portion. A protective layer 18 may or may not be utilized. A treatment fluid (i.e., chemicals) may be dispensed via channel 42 (or via any other type of dispensing system) as part of the process.

Suitable chemicals for the above operations may include, e.g., an oxidizing agent such as $H_2O_2$, HMDS (Hexamethyldisilazane), an acid, a base, an organic solvent, an inorganic solvent, or commercial chemicals, such as AP6000. Moreover, the chemical solution can be dispensed in any manner (in addition to that described above) such that only an outer edge region of both the wafer 10 and film 12 are affected. Furthermore, the chemical solution may be applied under supercritical conditions.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method for treating an outside edge region of a wafer, comprising:

providing a stack of material covering a wafer surface;

removing the stack of material along an outer edge region of the wafer to expose a top of the wafer surface along the outer edge region;

applying a protective film over a central region of the wafer such that only the outer edge region of the wafer surface and an outer edge region of the stack of material on the wafer are exposed; and applying a plasma treatment to the wafer, wherein the protective film protects a central portion of the stack of material and limits treatment to the outer edge region of both the wafer surface and stack of material on the wafer.

2. The method of claim 1, comprising the further step of removing the protective film.

3. The method of claim 1, wherein the stack of material comprises a dielectric thin film.

4. The method of claim 1, wherein the plasma treatment causes the outer edge region of both the wafer surface and stack of material on the wafer to densify.

5. The method of claim 1, wherein the plasma treatment enhances adhesion characteristics and inhibits delamination of at least one layer of material situated on a wafer surface.

6. The method of claim 1, wherein the plasma treatment consists of a treatment selected from the group consisting of: cleaning, changing of the chemical composition of the material, and removal of material.

7. A method for treating an outside edge region of a wafer, comprising:
providing a wafer that includes a stack of material situated on a wafer surface, wherein the stack of material is recessed back from an edge of the wafer such that an outer edge region including a top of the wafer surface is left exposed;
providing a plasma delivery system that limits a plasma exposure to both the outer edge region of the wafer surface and an outer edge region of the stack of material on the wafer surface; and
applying a plasma treatment to the outer edge region of both the wafer and stack of material, wherein a central portion of the stack of material situated on the wafer is not exposed to the plasma treatment.

8. The method of claim 7, comprising the further step of rotating the wafer in order to expose an entire outer circumferential region of both the wafer and stack of material situated on the wafer to the plasma treatment.

9. The method of claim 7, wherein the plasma delivery system comprises a ring-shaped electrode that can be placed above an entire outer circumferential region of both the wafer and stack of material situated on the wafer.

10. The method of claim 7, wherein the stack of material comprises a dielectric thin film.

11. The method of claim 7, wherein the plasma treatment causes the outer edge region of both the wafer and stack of material on the wafer surface to densify.

12. The method of claim 7, wherein the plasma treatment enhances adhesion characteristics and inhibits delamination of the stack of material.

13. The method of claim 7, wherein the plasma treatment consists of a treatment selected from the group consisting of: cleaning, changing of the chemical composition of the material, and removal of material.

* * * * *